United States Patent
Liu

(10) Patent No.: US 7,354,523 B2
(45) Date of Patent: Apr. 8, 2008

(54) METHODS FOR SIDEWALL ETCHING AND ETCHING DURING FILLING OF A TRENCH

(75) Inventor: Yuh-Turng Liu, Liouguci Shiang (TW)

(73) Assignee: Macronix International Co., Ltd., Hsinchu (TW)

( * ) Notice: Subject to any disclaimer, the term of this patent is extended or adjusted under 35 U.S.C. 154(b) by 181 days.

(21) Appl. No.: 10/872,086

(22) Filed: Jun. 17, 2004

(65) Prior Publication Data
US 2005/0279732 A1 Dec. 22, 2005

(51) Int. Cl.
*H01L 21/302* (2006.01)

(52) U.S. Cl. ............................ 216/41; 216/46; 216/51; 216/83; 216/93; 216/99; 438/696; 438/700; 438/702; 438/745; 438/942; 438/973

(58) Field of Classification Search ...................... None
See application file for complete search history.

(56) References Cited

U.S. PATENT DOCUMENTS

| | | | | |
|---|---|---|---|---|
| 4,714,520 A * | 12/1987 | Gwozdz | ...................... | 438/699 |
| 5,164,881 A * | 11/1992 | Ahn | ........................... | 361/313 |
| 5,893,758 A * | 4/1999 | Sandhu et al. | ............... | 438/708 |
| 6,797,582 B2 * | 9/2004 | Gluschenkov et al. | ....... | 438/392 |
| 6,802,944 B2 * | 10/2004 | Ahmad et al. | ......... | 204/192.23 |
| 6,884,724 B2 * | 4/2005 | Hsu et al. | .................... | 438/692 |
| 6,992,016 B2 * | 1/2006 | Nakamoto et al. | .......... | 438/745 |
| 7,064,032 B2 * | 6/2006 | Hsu et al. | .................... | 438/266 |
| 2004/0127051 A1 * | 7/2004 | Lee | ............................. | 438/692 |
| 2005/0064674 A1 * | 3/2005 | Lee et al. | .................... | 438/397 |

* cited by examiner

*Primary Examiner*—Anita K Alanko
(74) *Attorney, Agent, or Firm*—Stout, Uxa, Buyan & Mullins, LLP

(57) ABSTRACT

A method for sidewall etching includes providing a substrate having a trench defined therein, with the trench having fill material disposed over a bottom thereof, along a sidewall thereof, and at the trench opening. The fill material along the sidewall of the trench and at the trench opening is removed without removing the fill material disposed over the bottom of the trench. The fill material along the sidewall and at the trench opening may be removed without removing the fill material disposed over the bottom of the trench by inhibiting a reaction between an etchant and the fill material over the bottom of the trench. The reaction between the etchant and the fill material may be inhibited by causing an air bubble to form at the bottom of the trench. The air bubble may be formed by inverting the substrate, and immersing the inverted substrate in an etchant.

19 Claims, 5 Drawing Sheets

METHODS FOR SIDEWALL ETCHING AND ETCHING DURING FILLING OF A TRENCH

BACKGROUND OF THE INVENTION

1. Field of the Invention

The present invention relates generally to semiconductor fabrication and, more particularly, to a method for sidewall etching, a method for etching during filling of a trench, and a method for semiconductor structure fabrication by shallow trench isolation in which a trench feature is formed in a substrate.

2. Description of the Related Art

In the fabrication of semiconductor devices, integrated circuit structures are typically fabricated in the form of multi-layer, also known as multi-level structures. Beginning at the substrate layer or level, transistor devices having diffusion regions are formed over and into silicon substrates. In subsequent layers, interconnect metallization lines are patterned and electrically connected to the transistor devices to define the desired functional device. As is well known, patterned conductive layers are insulated from other conductive layers by dielectric materials such as silicon dioxide. The insulating layers essentially form a substrate layer or level in a multi-layer structure. As used herein, the term "substrate" includes both a base substrate such as a silicon semiconductor wafer, and any substrate layer or level of a multi-layer structure.

In the fabrication of features in and on the substrate, trenches are typically formed in one material, e.g., a silicon substrate, polycrystalline silicon, metal or a dielectric substrate layer or level, and then filled with another material. An exemplary process is shallow trench isolation (STI) in which trenches are formed to define an active area of a device such as a well, a transistor, a memory cell, etc. Trenches are formed in the substrate to isolate a region that may eventually be doped to define a device. The trenches are filled with another, and often a different, dielectric material or a metal as the structures are fabricated.

FIGS. 1A, 1B, and 1C illustrate a typical STI fabrication process. As shown in FIG. 1A, trenches 12 are formed in a substrate 10. For ease of illustration, substrate 10 in FIGS. 1A, 1B, and 1C is illustrated as a silicon substrate 10 such as a semiconductor wafer. As is known, fabrication in subsequent substrate levels or layers may or may not include all of the process steps illustrated and described herein, and depending on fabrication process utilized, may or may not include additional processing operations not illustrated or described herein.

Returning to FIG. 1A, a pad oxide layer 14 is formed over the substrate 10, and a nitride layer 16 is formed over the pad oxide layer 14. By way of example, nitride layer 16 might be a layer of SiN. Trenches 12 have been formed through the nitride layer 16 and the pad oxide layer 14, and into the substrate 10.

FIG. 1B shows a next process step of the STI fabrication process begun in FIG. 1A. In FIG. 1B, a liner 18 is shown in trenches 12. In some applications, the liner 18 is an oxide or other material grown inside the trench 12. Depending on the substrate, and the material, the liner 18 may or may not be used.

FIG. 1C shows a fill layer 20 deposited over the structure filling trenches 12 and covering nitride layer 16. The fill layer 20 is typically an oxide or metal, such as tetraethylorthosilicate (TEOS), oxide formed by using high density plasma (HDP), silicon dioxide, and the like, and may be deposited over the structure by chemical vapor deposition (CVD). Once the fabrication has reached the stage represented in FIG. 1C, processing continues to remove the fill layer 20, the nitride layer 16, and the pad oxide layer 14, leaving the trench 12 filled and prepared for continued structure fabrication.

A conventional technique for filling the trench 12 formed in substrate 10, e.g., the trench 12 formed in STI fabrication operations, includes CVD of a dielectric material or of a conductive material. Due to the topography of the trench 12, however, material deposited usually accumulates at the opening of the trench 12, inhibiting the filling. FIG. 2A shows a detail view of a substrate 10 having a trench 12 formed therein, and a partially-deposited fill layer 20. A liner 18 has been formed in trench 12, and fill layer 20 has been deposited to fill trench 12. As can be seen in FIG. 2A, deposition of fill layer 20 results in significant narrowing at trench opening 22. Continued deposition of fill layer 20 may or may not result in complete filling of trench 12, and to prevent incomplete filling of trench 12 and formation of unacceptable voids in the fill layer 20, additional processing to widen trench opening 22 is often required.

FIG. 2B illustrates the formation of a void 24 within the fill layer 20 in trench 12 if additional processing to widen trench opening 22 is not accomplished. Typically, a process such as dry etching is utilized to remove the material that narrows trench opening 22, so that filling can further proceed. However, when etching the material on the sidewall and trench opening 22, the material formed at the bottom of the trench 12 is inevitably removed as well. Therefore, dry etching is not an ideal method to enhance or facilitate the access to a formed trench and enable trench filling.

As process technology evolves, resulting in smaller features and more complex and dense semiconductor structures fabricated in and on substrates, trenches become smaller and narrower, and trench openings become increasingly susceptible to blockage during trench-filling processes. As is well known, voids in trench filling material are unacceptable. As such, a method of etching to be used in trench-filling processes that enables sufficient access for complete trench-filling without voids and without removal of desired material at the bottom of the trench is needed.

SUMMARY OF THE INVENTION

Broadly speaking, the present invention fills this need by providing a method for sidewall etching that improves access to trench structures or features without removing deposited material at a bottom of a trench or gap. Several exemplary embodiments of the present invention are described below.

In accordance with one aspect of the present invention, a method for etching during filling of a trench is provided. In this method, a semiconductor substrate having a trench defined therein and a fill layer deposited over the substrate and at least partially filling the trench is provided. The semiconductor substrate is inverted, and the inverted substrate is immersed in an etchant to remove portions of the fill layer on the sidewall and at an opening of the trench. When the inverted substrate is immersed in the etchant, air is trapped at a bottom of the trench. This trapped air inhibits a reaction between the etchant and a portion of the fill layer at the bottom of the trench such that the portion of the fill layer at the bottom of the trench remains after the portions of the fill layer on the sidewall and at the opening of the trench have been removed.

In accordance with another aspect of the present invention, a method for sidewall etching is provided. In this method, a substrate having a trench defined therein is provided. The trench has fill material disposed over a bottom of the trench, along a sidewall of the trench, and at the trench opening. The fill material along the sidewall of the trench and at the trench opening is removed without removing the fill material disposed over the bottom of the trench. In one embodiment, the removing of the fill material along the sidewall of the trench and at the trench opening without removing the fill material disposed over the bottom of the trench includes inhibiting a reaction between an etchant and the fill material over the bottom of the trench. In one embodiment, the inhibiting of the reaction between the etchant and the fill material includes causing an air bubble to form at the bottom of the trench.

In accordance with yet another aspect of the present invention, a method for semiconductor feature fabrication by shallow trench isolation in which a trench feature is formed in a substrate is provided. In this method, a fill layer is deposited over the substrate and into the trench feature. The fill layer at least partially fills the trench feature and is deposited such that a trench opening and a trench sidewall includes fill material restricting access into an interior of the trench feature and preventing complete filling of the trench feature without unacceptable voids in the fill material. The fill layer is etched to remove the fill layer from over the substrate at the trench opening and along the trench sidewall without removing the fill layer at the bottom of the trench feature. Thereafter, additional fill material is deposited over the substrate to completely fill the trench feature with fill material free of unacceptable voids. In one embodiment, the etching of the fill layer includes causing an air bubble to form at the bottom of the trench feature, with the air bubble preventing the etching of the fill layer at the bottom of the trench feature. In one embodiment, the etching of the fill layer includes inverting the substrate, and immersing the inverted substrate in an etchant.

The present invention provides a number of significant advantages. One notable benefit and advantage of the invention is the ability to etch away material blocking a trench opening without removing the material at the bottom of the trench. As features continue to be fabricated smaller and more densely populating a semiconductor substrate, susceptibility to blocked trenches or gaps when depositing a fill layer increases. In accordance with embodiments of the present invention, intermediate etching of the fill layer at a trench opening, and at least part of the trench sidewall, is accomplished while the fill material at the bottom of the trench is protected from etching. Subsequent deposition of fill material can completely fill the trench without unacceptable voids.

Other advantages of the invention will become apparent from the following detailed description, taken in conjunction with the accompanying drawings, illustrating by way of example the principles of the invention.

BRIEF DESCRIPTION OF THE DRAWINGS

The accompanying drawings, which are incorporated in and constitute part of this specification, illustrate exemplary embodiments of the invention and together with the description serve to explain the principles of the invention.

DETAILED DESCRIPTION OF EXEMPLARY EMBODIMENTS

Figure 1A:
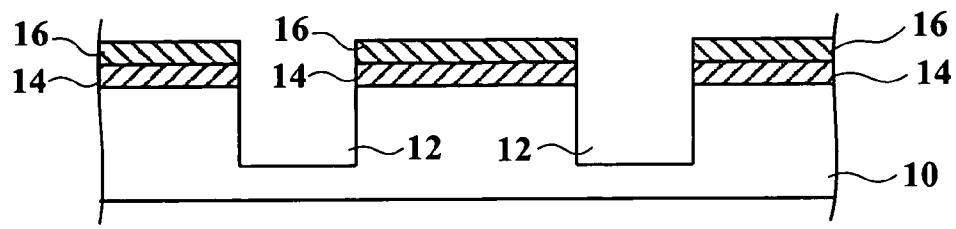
FIG. 1A illustrates a typical shallow trench isolation fabrication process.
Figure 1B:
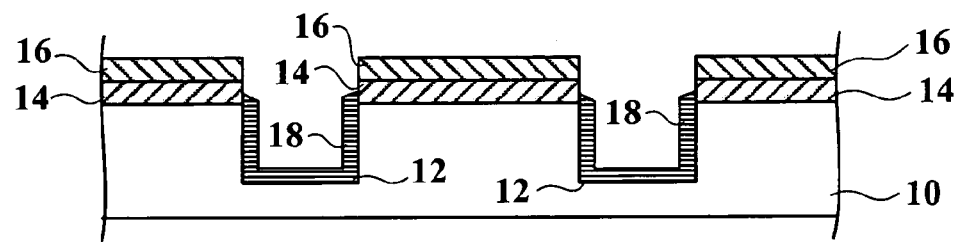
FIG. 1B shows a next process step of the shallow trench isolation fabrication process begun in FIG. 1A.
Figure 1C:
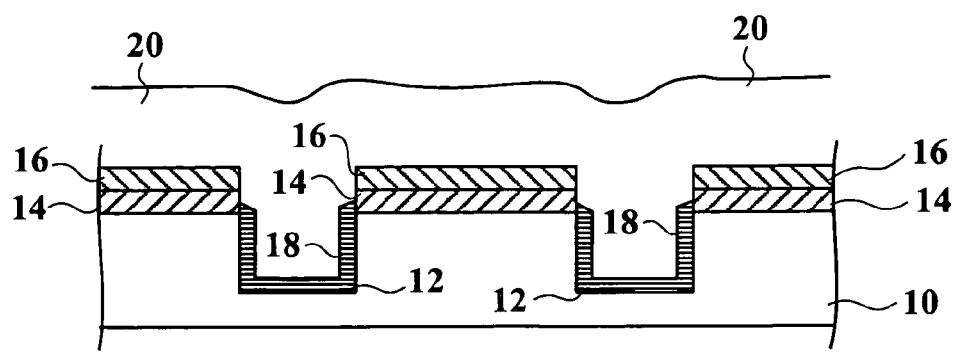
FIG. 1C shows a fill layer deposited over the structure filling the trenches and covering the nitride layer.
Figure 2A:
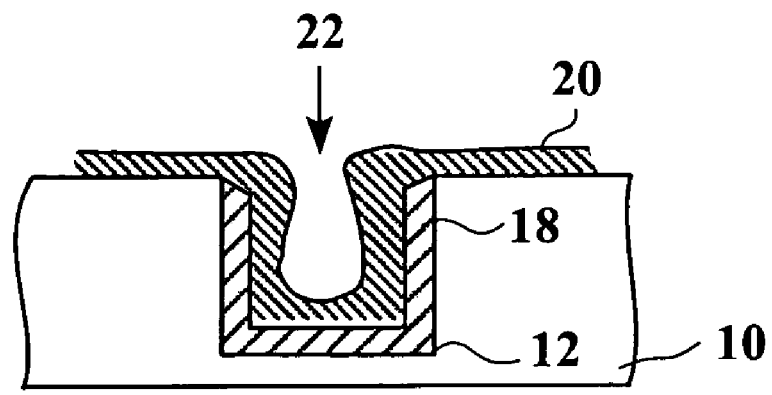
FIG. 2A shows a detail view of a substrate having a trench formed therein, and a partially-deposited fill layer.
Figure 2B:
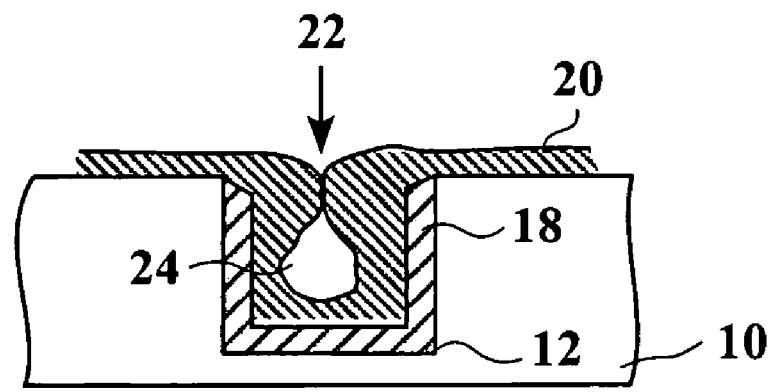
FIG. 2B illustrates the formation of a void within the fill layer in the trench if additional processing to widen the trench opening is not accomplished.

Several exemplary embodiments of the methods of the present invention will now be described with reference to the accompanying drawings. FIGS. 1A-1C and 2A-2B have been discussed above in the "Background of the Invention" section.

As described above, in the fabrication of semiconductor structures, trenches or gaps are often defined in a substrate such as those features defined in shallow trench isolation (STI) processes. STI features and processes are used herein as exemplary features and processes. It should be understood that any other fabrication process in which trenches, gaps, interconnect lines, holes, and the like are formed or defined in a substrate can benefit from the present invention. The terms "trench" and "trenches" as used herein should be understood to include gaps, interconnect lines, holes, and any manner of similar feature.

Once defined in a substrate of one type of material, e.g., silicon or a desired dielectric, the trench is filled with another type of, or a different, material, e.g., a desired dielectric, polysilicon, or metal. During the trench-filling process, however, trench-filling material commonly builds up on the sidewall of the trench and at the trench opening resulting in incomplete trench filling, or voids within the trench-filling material. Embodiments of the present invention provide for methods of intermediate etching of the structure in which trenches are to be filled to enable complete trench-filling without removal of deposited material at the bottom of the trench.

In one embodiment of the present invention, a substrate in which semiconductor structures are defined that include trenches to be filled is provided. The trenches may or may not include a liner layer within the trench, and the substrate surface may or may not include multiple layers such as nitride layers, barrier layers, and the like through which the trenches are defined into the substrate. The substrate is provided with a trench-filling layer at least partially deposited thereon. As is well known, a trench-filling layer is deposited over the substrate to fill the trenches.

An exemplary process utilized to deposit the trench-filling layer is chemical vapor deposition (CVD). Exemplary materials deposited for trench-filling by CVD include dielectrics such as tetraethylorthosilicate (TEOS), silicon dioxide ($SiO_2$), borophosphosilicate glass (BPSG), oxide formed by high density plasma (HDP), and the like, and conductive materials including polysilicon, and metals such as tungsten, copper, aluminum, titanium, and the like.

In one embodiment, after trench-filling material is at least partially applied so that the trenches are partially filled, the substrate is immersed in a tank filled with an etchant so that the trench-filling layer is in contact with the etchant to cause a reaction. The substrate is inverted so that the trench openings face the etchant in which the substrate is immersed. The trench-filling material is thus removed from the trench or gap openings and the sidewall at or near the gap openings. The material in the bottom of the trench is protected from etching by an air bubble that is trapped within the trench when the inverted substrate is immersed in the etchant. Preferred etchants are selected depending on the trench-filling material to be etched and the desired selectivity to any barrier that may exist, e.g., the substrate material, and include diluted HF, $H_2O_2$, $H_3PO_4$, or a mixture of HCl and $HNO_3$.

Figure 3A:
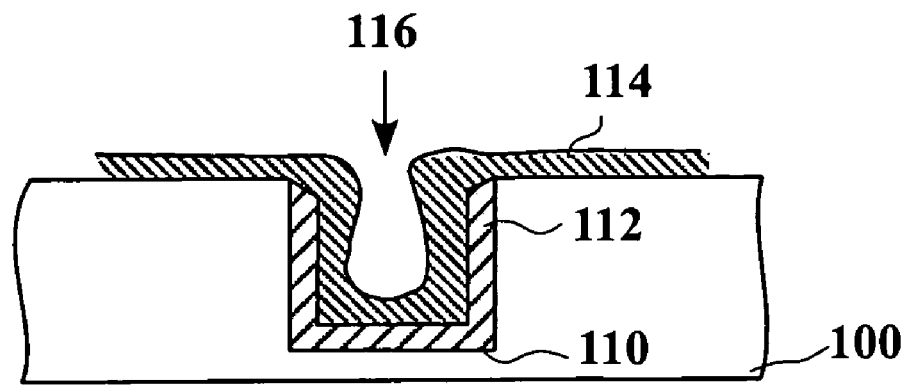
FIG. 3A shows a substrate for fabrication in accordance with one embodiment of the present invention.

FIG. 3A shows a substrate 100 for fabrication in accordance with one embodiment of the present invention. Substrate 100 includes a trench 110 formed therein. Trench 110 is formed in accordance with known semiconductor fabrication processes for semiconductor manufacture of which STI is an exemplary process. A barrier 112 is shown formed in trench 110, and a partially deposited fill layer 114 is shown deposited over substrate 100 and into trench 110. The partially deposited fill layer 114 is shown to be partially filling trench 110 with a void remaining within trench 110, and the accumulated fill material narrowing the opening of trench 110 at the top indicated at 116.

Following the partial deposition of fill layer 114, e.g., by a process such as CVD, a method of etching the partially deposited fill layer 114 to enhance access to the trench opening 116 and enable complete filling of trench 110 without unacceptable voids is provided. It should be understood that material deposited by CVD or other semiconductor fabrication process may form miniscule or inconsequential voids within the material. As used herein, the phrase "unacceptable voids" refers to voids that result in a completed structure being rendered defective, faulty or otherwise unacceptable due to a void in the material. In one embodiment, the opening of a trench feature, and the upper sidewall of the trench feature are etched while the fill material at the bottom of the trench is protected from etching to enable complete filling of the trench feature in subsequent deposition of fill material.

Figure 3B:
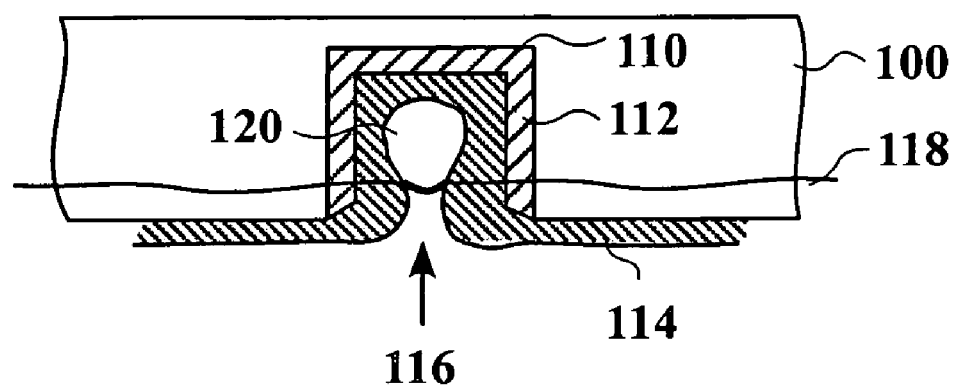
FIG. 3B shows etching of the partially deposited fill layer in accordance with one embodiment of the present invention.

FIG. 3B shows etching of the partially deposited fill layer 110 in accordance with one embodiment of the present invention. Substrate 100 is inverted and immersed in an etchant 118. Suitable etchants are selected depending on the material to be etched, any desired selectivity to barrier, liner, and substrate material, and other known considerations, and include diluted HF, $H_2O_2$, $H_3PO_4$, or mixture of HCl and $HNO_3$. Other suitable etchants are readily available and known to those skilled in the art. In one embodiment, the inverted substrate 100 is positioned in etchant 118 so that partially deposited fill layer 114 is in contact with etchant 118. The contact between the partially deposited fill layer 114 and the etchant 118 results in a reaction between the material of the partially deposited fill layer 114 and the etchant 118, etching the partially deposited fill layer 114.

Within trench 110 of inverted substrate 100, a bubble 120 forms protecting the fill material at the bottom of the trench 110. As illustrated in FIG. 3B, the substrate 100 is inverted. The bottom of the trench 110 is therefore in an upper region of inverted substrate 100 opposite the trench opening 116. Turning back to FIG. 3A, the trench opening 116 opens from a surface of substrate 100 into the ambient environment. The trench 110 extends into the substrate 100 creating a space or void. When the substrate 100 is inverted and immersed in a fluid as shown in FIG. 3B, the air within the space or void is trapped as a bubble 120 against the bottom of the trench 110.

In one embodiment, bubble 120 protects fill material at the bottom of trench 110 from etchant 118. As the etchant 118 effects etching of partially deposited fill layer 114, the fill material at trench opening 116 and the sidewall of trench 110 near trench opening 116 are etched which facilitates access to trench 110. Fill material at the bottom of trench 110 remains intact or as originally deposited. Subsequent deposition of fill material can completely fill trench 110 without unacceptable voids.

Figure 3C:
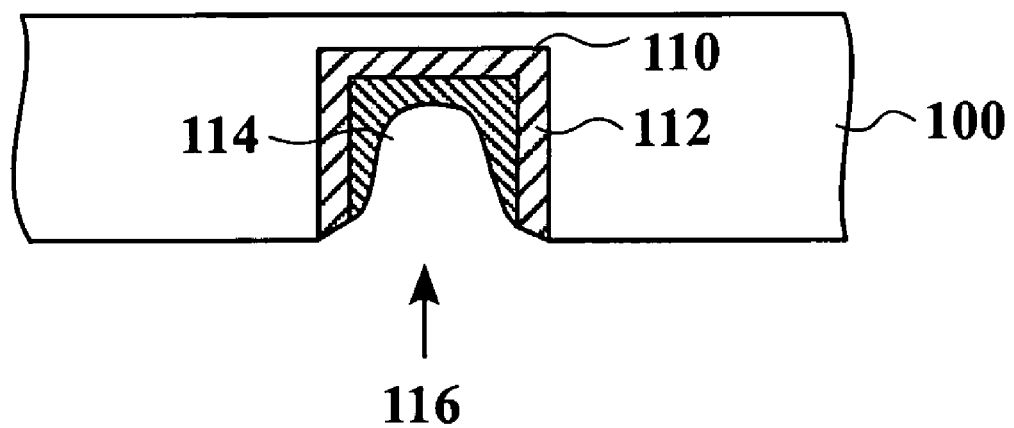
FIG. 3C shows the substrate following etching of partially deposited fill layer in accordance with an embodiment of the invention.

FIG. 3C shows substrate 100 following etching of partially deposited fill layer 114 in accordance with one embodiment of the invention. Substrate 100 has been removed from etchant 118 (see FIG. 3B) and remains inverted. Fill layer 114 remains only at the bottom of trench 110, having been protected from etching by bubble 120 (see FIG. 3B). Fill material has been etched away from trench opening 116, as well as the upper sidewall of trench 110 to facilitate access to interior of trench 110. Subsequent deposition of fill material can completely fill trench 110 without voids.

Figure 4:
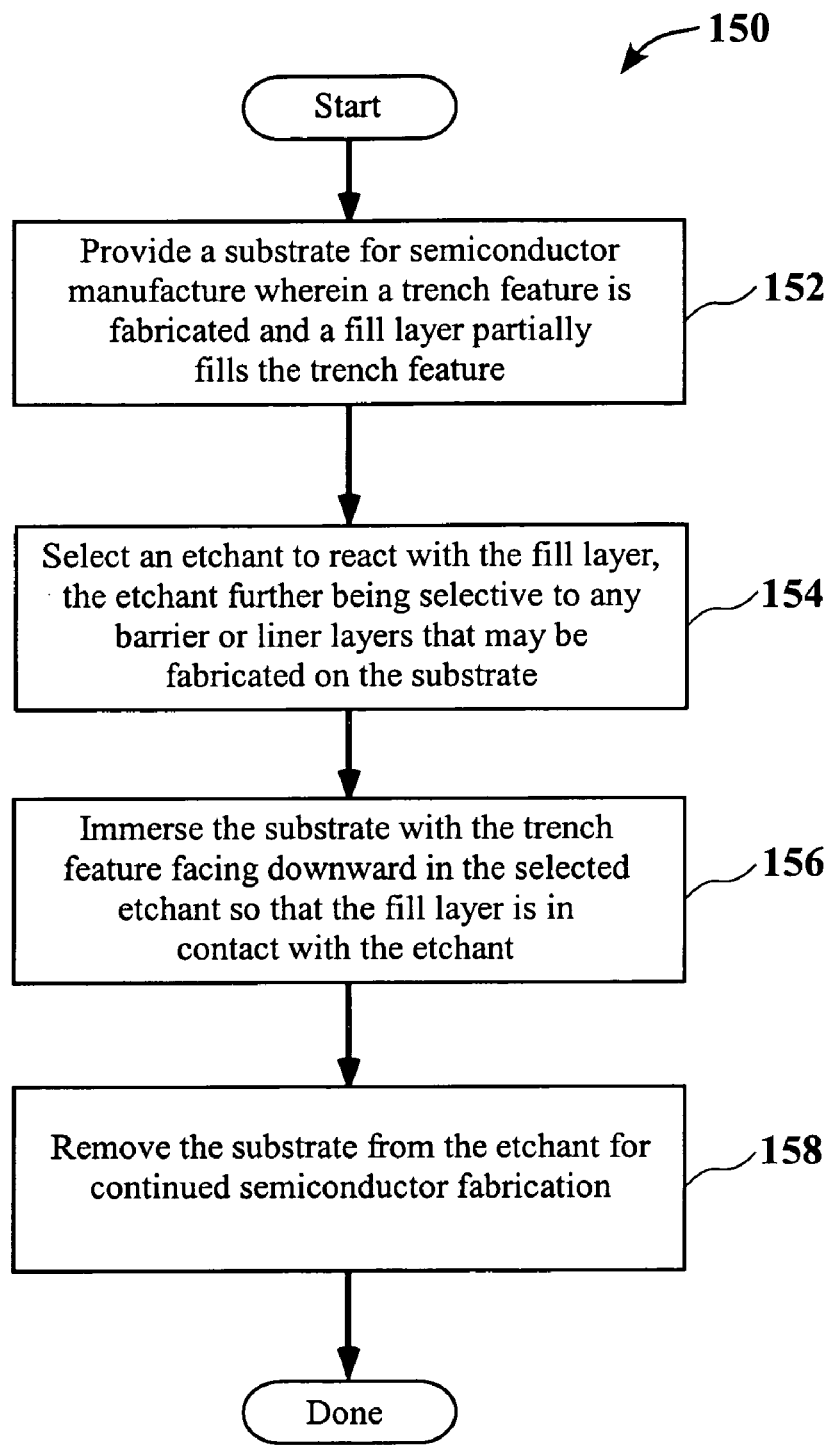
FIG. 4 is a flow chart diagram illustrating the method operations performed when etching a trench opening and a trench sidewall in accordance with one embodiment of the present invention.

FIG. 4 is a flow chart diagram 150 illustrating the method operations performed when etching a trench opening and trench sidewall in accordance with one embodiment of the present invention. The method begins with operation 152 in which a substrate for semiconductor manufacture is provided. The substrate, as described above, may also be a substrate layer or level of a multi-layer semiconductor structure. In the substrate, a trench feature is fabricated and a fill layer is deposited to partially fill the trench feature. An exemplary trench feature is a trench as fabricated in STI semiconductor manufacturing processes. The trench feature is typically fabricated into the substrate, which can be silicon, a dielectric material, metal, etc.

The fill layer is typically deposited over the substrate and into the trench feature by a manufacture or fabrication process such as CVD. The fill layer can be of any material as desired, and is usually a dielectric material such as TEOS, $SiO_2$, BPSG, oxide formed by HDP, a conductive material such as polysilicon, or a metal such as tungsten, aluminum, copper, and titanium. When the fill material is deposited over the substrate and into the trench, the opening of the trench significantly narrows as the fill material builds up on the sidewall and edges of the trench at the trench opening.

The method continues with operation 154 in which an etchant is selected to react with the fill layer. If a barrier has been fabricated within the trench feature, the etchant that is typically selected is selective to the barrier. In one embodiment, the fill layer is partially deposited over the substrate and into the trench feature. The opening of the trench feature is significantly narrowed from build up of the fill material on the sidewall and on the edges at the trench opening. Continued deposition of fill material can result in unacceptable voids and incomplete filling of blocked trench openings of the trench features, and an etchant is selected to etch the fill material and facilitate access to an interior region of the trench feature and enable complete filling without unacceptable voids. Preferred etchants are selected depending on the trench-filling material to be etched and the desired selectivity to the barrier, the substrate or substrate level or layer material, and include diluted HF, $H_2O_2$, $H_3PO_4$, or a mixture of HCl and $HNO_3$.

Next, in operation 156, the substrate is immersed in the etchant with the trench feature facing downward. The substrate, with the trench feature fabricated therein, is inverted and immersed in the etchant so that the fill layer is in contact with, and therefore reacts with, the etchant. Because the trench feature is fabricated into the substrate, when the substrate is inverted and immersed in the etchant, air is trapped as a bubble at the bottom of the trench. The bubble blocks the etchant from contact with the fill material at the bottom of the trench feature, and the fill material remains intact as deposited at the bottom of the trench.

The method concludes with operation 158 in which the substrate is removed from the etchant for continued semiconductor manufacture. In one embodiment, the continued manufacture includes subsequent deposition of the fill layer over the fill material remaining at the bottom of the trench. In this manner, the trench feature is completely filled without unacceptable voids. With the removal of the substrate from the etchant, the method is done.

In summary, the present invention provides a method for sidewall etching, a method for etching during filling of a trench, and a method for semiconductor structure fabrication by shallow trench isolation in which a trench feature is formed in a substrate. The invention has been described herein in terms of several exemplary embodiments. Other embodiments of the invention will be apparent to those skilled in the art from consideration of the specification and practice of the invention. The embodiments and preferred features described above should be considered exemplary, with the scope of the invention being defined by the appended claims and their equivalents.

What is claimed is:

1. A method for etching during filling of a trench, comprising:
   providing a semiconductor substrate having a trench defined therein and a fill layer deposited over the substrate and at least partially filling the trench;
   inverting the semiconductor substrate; and
   immersing the inverted substrate in an etchant to remove portions of the fill layer on a sidewall and at an opening of the trench, wherein, when the inverted substrate is immersed in the etchant, air is trapped at a bottom of the trench and the trapped air inhibits a reaction between the etchant and a portion of the fill layer at the bottom of the trench such that the portion of the fill layer at the bottom of the trench remains after the portions of the fill layer on the sidewall and at the opening of the trench have been removed.

2. The method of claim 1, wherein the etchant is a member selected from the group consisting of diluted HF, $H_2O_2$, $H_3PO_4$, and a mixture of HCl and $HNO_3$.

3. The method of claim 1, wherein the fill layer is a member selected from the group consisting of a dielectric, a conductive material, and a metal.

4. The method of claim 3, wherein the dielectric is a member selected from the group consisting of tetraethylorthosilicate (TEOS), silicon dioxide ($SiO_2$), borophosphosilicate glass (BPSG), and oxide formed by using high density plasma (HDP).

5. The method of claim 3, wherein the conductive material includes polysilicon.

6. The method of claim 3, wherein the metal is a member selected from the group consisting of tungsten, aluminum, copper, and titanium.

7. The method of claim 1, wherein the fill layer is deposited over the substrate by chemical vapor deposition (CVD) or plasma enhanced chemical vapor deposition (PECVD).

8. A method for sidewall etching, comprising:
   providing a substrate having a trench defined therein, the trench having a fill material disposed over a bottom of the trench, along a sidewall of the trench, and at a trench opening; and
   removing the fill material along the sidewall of the trench and at the trench opening without removing the fill material disposed over the bottom of the trench when the substrate is inverted and immersed in an etchant.

9. The method of claim 8, wherein the removing of the fill material along the sidewall of the trench and at the trench opening without removing the fill material disposed over the bottom of the trench includes inhibiting a reaction between the etchant and the fill material over the bottom of the trench.

10. The method of claim 9, wherein the inhibiting of the reaction between the etchant and the fill material includes causing an air bubble to form at the bottom of the trench.

11. The method of claim 10, wherein the etchant includes one of diluted HF, H2O2, $H_3PO_4$, and mixture of HCl and $HNO_3$, and the fill material is a member selected from the group consisting of a dielectric, a conductive material, and a metal.

12. The method of claim 11, wherein the dielectric is a member selected from the group consisting of tetraethylorthosilicate (TEOS), silicon dioxide ($SiO_2$), borophosphosilicate glass (BPSG), and oxide formed by using high density plasma (HDP).

13. The method of claim 11, wherein the conductive material includes polysilicon.

14. The method of claim 11, wherein the metal is a member selected from the group consisting of tungsten, aluminum, copper, and titanium.

15. A method for semiconductor structure fabrication by shallow trench isolation in which a trench feature is formed in a substrate, comprising:
   depositing a fill layer over the substrate and into the trench feature, the fill layer at least partially filling the trench feature and being deposited such that a trench opening and a trench sidewall includes fill material restricting access into an interior of the trench feature and preventing complete filling of the trench feature without unacceptable voids in the fill material;
   etching the fill layer to remove the fill layer from over the substrate at the trench opening and along the trench sidewall without removing the fill layer deposited at a bottom of the trench feature when the substrate is inverted and immersed in an etchant; and
   depositing additional fill material over the substrate to completely fill the trench feature with fill material free of unacceptable voids.

16. The method of claim 15, wherein the etching of the fill layer includes causing an air bubble to form at the bottom of the trench feature, the air bubble preventing the etching of the fill layer at the bottom of the trench feature.

17. The method of claim 15, wherein the etchant is a member selected from the group consisting of diluted HF, $H_2O_2$, $H_3PO_4$, and mixture of HCl and $HNO_3$.

18. The method of claim 15, wherein the fill layer is a member selected from the group consisting of a dielectric, a conductive material, and a metal.

19. The method of claim 18, wherein the dielectric is a member selected from the group consisting of tetraethylorthosilicate (TEOS), silicon dioxide ($SiO_2$), borophosphosilicate glass (BPSG), and oxide formed by using high density plasma (HDP).

* * * * *